United States Patent [19]

Boschert

[11] 4,061,931
[45] Dec. 6, 1977

[54] SWITCHING REGULATOR POWER SUPPLY MAIN SWITCHING TRANSISTOR TURN OFF SPEED UP CIRCUIT

[75] Inventor: Robert J. Boschert, Sunnyvale, Calif.

[73] Assignee: Boschert Associates, Sunnyvale, Calif.

[21] Appl. No.: 712,222

[22] Filed: Aug. 6, 1976

[51] Int. Cl.² ............................................. H03K 17/00
[52] U.S. Cl. ................................... 307/300; 307/240; 307/297; 323/22 T
[58] Field of Search ................. 307/300, 29, 240, 270, 307/254; 323/4, 9, 22 T

[56] References Cited

U.S. PATENT DOCUMENTS

| 3,081,437 | 3/1963 | Radcliffe, Jr. | 307/300 |
| 3,129,354 | 4/1964 | Hellstrom | 307/300 |
| 3,546,492 | 12/1970 | Barchok | 307/300 |
| 3,688,153 | 8/1972 | Wheatley, Jr. | 307/300 |

Primary Examiner—Stanley D. Miller, Jr.
Assistant Examiner—B. P. Davis

[57] ABSTRACT

A switching regulator power supply with an auto transformer in the output of the main transistor switch, the secondary of which feeds back a back biasing pulse to the main transistor switch base/emitter junction thus speeding up transistor turn off.

3 Claims, 2 Drawing Figures

SWITCHING REGULATOR POWER SUPPLY MAIN SWITCHING TRANSISTOR TURN OFF SPEED UP CIRCUIT

BACKGROUND OF THE INVENTION

1. Field of the invention.

This invention pertains to that field of art concerning electronic switching regulators and more particularly to a circuit for reducing turn off time of the main switching transistor used in these regulators.

2. Description of the prior art.

It is common knowledge that in switching transistor applications the turn on and off times are the periods of greatest power dissipation within the transistor. Due to thermal considerations it is imperative that these times be reduced as much as possible. Because fast trigger driver transistors are now available which can supply ample current quickly to the base/emitter junction of the main switching transistor, the turn on time is no longer a serious problem. This is not so as to the turn off time. Very high currents are customarily switched during conduction and the main switching transistor is in deep saturation. Collector current flows for some time after the termination of the cut off pulse. This is due to the fact that the large number of minority carriers necessary for saturation require some finite time to be swept clear of the collector/base junction. Various attempts have been made in the past to speed up the turn on and turn off times. Speed up capacitors have been used to bypass the base drive resistor to speed up turn on and transistor design has undergone modification. No one has as yet invented a workable method of speeding up turn off time. Due to the fact that any pulses fed back to the main switching transistor must of necessity be regenerative to accomplish this end, oscillations frequently occur. This invention provides the necessary filter and storage inductance in the main switching transistor output as well as speeding up transistor turn off and at the same time avoids oscillations.

SUMMARY

The heart of this invention is an auto transformer having its primary in series with the output of the main transistor switch, hereinafter termed switch. When the current changes in the primary a voltage is induced in the secondary which is capacitively coupled back to the switch base/emitter junction so as to back bias the said junction. Forward biasing voltages are shorted out by a diode. The inductance of the primary is selected so that it acts as the inductor commonly used in switching regulators. The object of this invention is to provide a storage inductance in the switch output, speed up turn off and avoid regenerative oscillations.

DESCRIPTION OF THE PREFERRED EMBODIMENT

Figure 1:
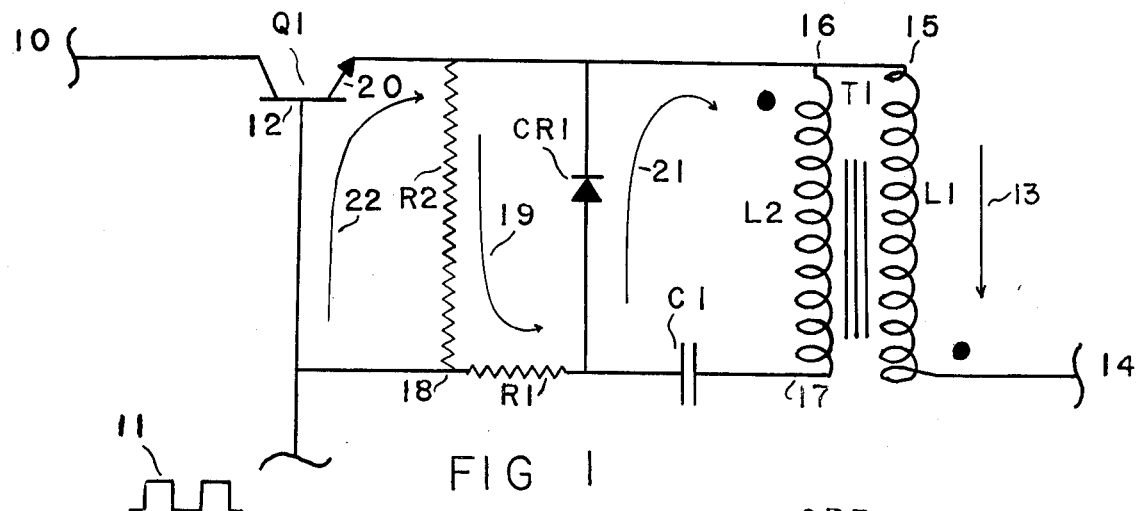
FIG. 1 is a simplified schematic of this invention showing the essential elements.

Referring now to the drawings wherein like reference characters designate like or corresponding parts throughout the several views, there is shown in FIG. 1 an embodiment of this invention showing only the essential elements that are new. The switch Q1 receives an unregulated D.C. input 10 and is driven by control pulses 11 from an outside source not shown. When a positive control pulse is applied to the base 12 of the switch Q1 it turns on and conventional current shown by arrow 13 flows through the primary L1 of the transformer T1 to the regulated output 14. The transformer T1 terminals are connected as shown with the input terminal 15 of the primary L1 connected to one terminal of the secondary L2, hereinafter termed the common terminal 16. The coil phasing is arranged so that the other terminal of the secondary L2, hereinafter termed the pulse generating terminal 17 has a voltage developed with respect to the common terminal 16 which is the reverse of that developed across the primary L1. Positive pulses at the pulse generating terminal 17 pass through coupling capacitor C1 and are shorted back to the common terminal 16 by shorting diode CR1. Negative pulses passing through capacitor C1, however, are blocked by diode CR1 and are returned to the common terminal 16 way of two series connected resistors. One of these resistors is an isolating resistor R1 and the other is a voltage developing resistor R2. The junction 18 of these resistors R1 and R2 is connected to the base 12 of the switch Q1. The said negative pulses which are blocked by the shorting diode CR1 return to the common terminal 16 by way of isolating resistor R1 and voltage developing resistor R2. These pulses cause conventional current to flow in resistors R1 and R2 in the direction of the arrow 19 thus developing a back biasing voltage across the base/emitter junction 20 of the switch Q1. This accelerates switch Q1 turn off. The resistor R1 has the function of isolating the base/emitter junction 20 of the switch Q1 from the shorting diode CR1 thus steering conventional current shown by arrow 21 through the diode CR1 when the pulse generating terminal 17 of the secondary L2 produces a positive pulse. In a similar manner the resistor R1 steers conventional current shown by arrow 22 through the base/emitter junction 20 of the switch Q1 when a positive control pulse is applied to the base 12 of the switch Q1. The RC time constant of the capacitor C1 and the two resistors R1 and R2 is very short as compared to the switching frequency. Therefore this differentiated pulse vanishes quickly in readiness for the next pulse. Since regenerative pulses of only one polarity (but not both) are fed back to the switch Q1 base/emitter junction 20 oscillations do not take place.

Figure 2:
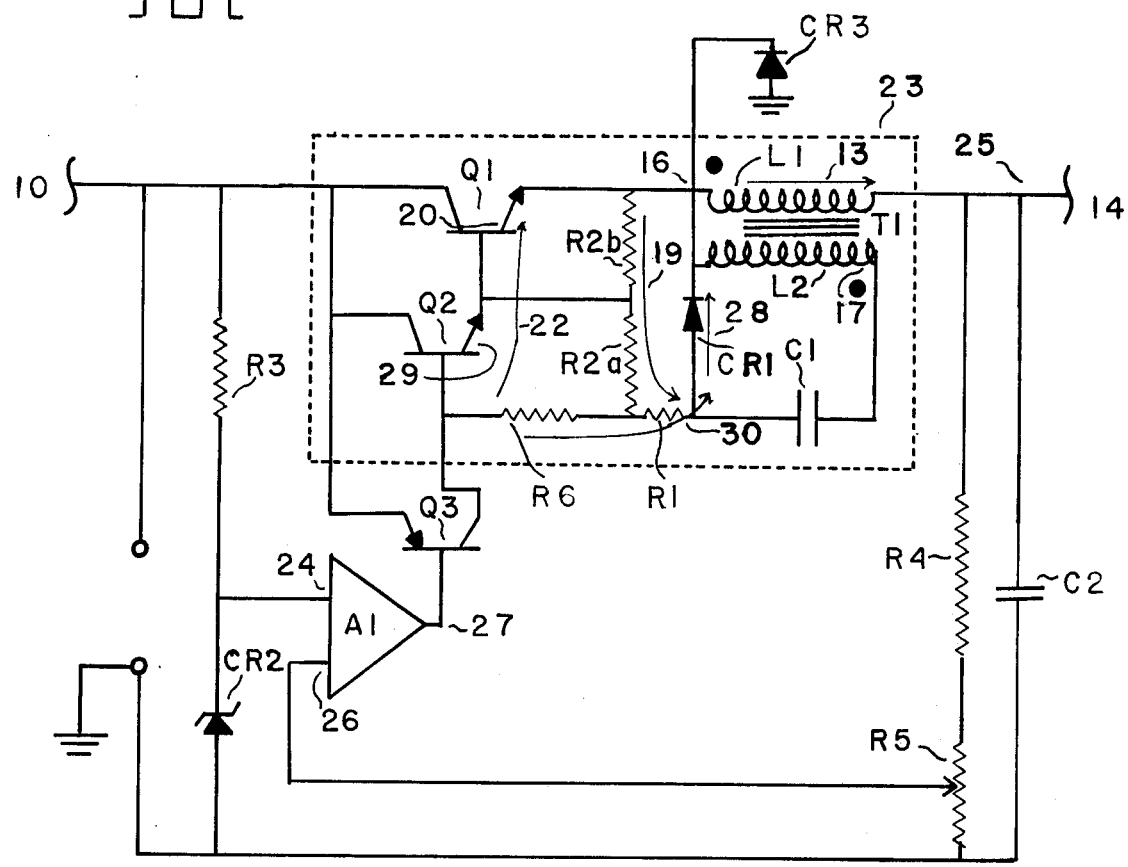
FIG. 2 is a schematic of this invention as used in a conventional switching regulator power supply.

In FIG. 2 the elements of the circuit comprising this invention are enclosed by dotted lines 23. The circuitry outside these lines is widely known and a very detailed description may be found in TAB Book/828, entitled Switching Regulators and Power Supplies by Irving Gottleib, 1st Edition printed Jan. 1976, Copyright 75-41722. A detailed description is therefore unnecessary and a very brief description will suffice.

An unregulated D.C. supply is provided at the input 10, a voltage dropping resistor R3 and a zener diode CR2 provide a reference voltage suitable for the non-inverting input 24 of an operational amplifier A1. As switch Q1 turns on and off phase shifted pulses are developed at the junction 25 of the filter inductor L1 and the filter capacitor C2. A voltage dividing resistor R4 and a potentiometer R5 reduce the voltage of these pulses to a value suitable for the inverting input 26 of the operational amplifier A1. The resulting regenerative pulses at the output 27 of the operational amplifier A1 are fed back to the base/emitter junction 20 of switch Q1 by way of trigger base drive transistors Q2 and Q3.

Diode CR3 is known as a "free wheeling" diode is in the circuit to allow the inductance L1 to draw conventional current from ground when its magnetic field collapses. Sustained oscillations result and an average D.C. output voltage appears at the regulated output 14.

Turning now to the area enclosed by the dotted lines 23, the turn off circuit here is slightly more elaborate than the one shown in FIG 1. When the switch Q1 turns on conventional current shown by arrow 13 passes through the primary L1 of the transformer T1 and a positive pulse is generated at the common junction terminal 16 of the primary L1 and the secondary L2. A pulse of similar polarity relative to the common terminal 16 appears at the pulse generating terminal 17 of the secondary L2. This pulse is passed through the capacitor C1 and shorted by diode CR1 back to the common terminal 16. Next when the switch Q1 turns off in response to a base drive control signal coming from the output 27 of the operational amplifier A1 through trigger drive transistors Q3 and Q2 a negative pulse appears at the pulse generating terminal 17 of the secondary L2. This pulse is blocked by diode CR1 and caused to return to the common terminal 16 by way of Resistors R1 and R2a and R2b. In so doing it causes conventional current to flow in these resistors in the direction of the arrow 19 thus developing a voltage across resistors R2a and R2b which back biases both the trigger drive transistor Q2 and the switch Q1. Isolating resistor R1 has the same function here as it did in FIG 1. Here, however, both the trigger driver Q2 and the switch Q1 are involved. Isolating resistor R1 serves to steer conventional current shown by arrow 28 through diode CR1 away from the trigger driver transistor Q2 and the switch Q1 when a positive pulse is generated at the pulse generating terminal 17. Likewise upon a negative pulse isolating resistor R1 allows conventional current to take the patch indicated by arrow 19 through resistors R2a and R2b thus back biasing both switch Q1 and trigger driver transistor Q2. The resistor R6 at the base 29 of the trigger driver transistor Q2 together with the isolating resistor R1 prevents conventional current from taking the path indicated by arrow 30 through the diode CR1 when a turn on signal is received from the output 27 of the operational amplifier A1. In effect conventional current is forced to take the path indicated by arrow 22 through the base/emitter junctions 29 and 20 of trigger driver transistor Q2 and switch Q1. The PNP transistor Q3 is used to match the output 27 of the operational amplifier A1 to the two NPN transistors Q2 and Q1 so as to give the proper phase relationship for regenerative oscillations. The following is a parts list showing typical values of the parts illustrated in FIG. 2 so that one skilled in the art can easily duplicate this circuit:

| SYMBOL | PART DESCRIPTION |
|---|---|
| Q1 | 2N6306 |
| Q2 | TIP 47 |
| Q3 | MPSA 93 |
| CR1 | 1N4148 |
| CR2 | 6.2 volt zener |
| CR3 | MR 852 |
| A1 | uA 723 I.C. by Fairchild |
| R1 | 10 Ohms |
| R2a | 10 Ohms |
| R2b | 10 Ohms |
| R3 | 100 K Ohms |
| R4 | 100 K Ohms |
| R5 | 2 K Pot. |
| R6 | 82 Ohms |
| C1 | .1 UF, 16 Volt |
| C2 | 9.0 UF 200 volt |
| T1 | 30/1 stepdown see pp 95 TAB Book 828 |

It should be understood of course that the foregoing disclosure relates to only a preferred embodiment and that numerous modifications or alterations may be made therein without departing from the spirit and scope of the invention as hereinafter defined by the appended claims as only a preferred embodiment thereof has been disclosed.

What is claimed is:

1. In a switching regulator power supply, a main switching transistor turnoff speedup circuit comprising:
    a transformer having a primary and a secondary winding, said primary winding connected in series between the output electrode of the main switching transistor and the output terminal of the power supply, the first end of said secondary winding connected to said output electrode, said secondary winding being wound to produce signals at its second end that are oppositely phased from corresponding signals at said output terminal of said power supply;
    signal feedback circuitry including a capacitor coupled in series between said second end of said secondary winding and the base of said switching transistor for applying said oppositely phased signals to said base; and
    signal bypass means coupled across said secondary winding for suppressing forward bias enabling signals from the base of said transistor and for applying negative biased regenerative turnoff signals to said base.

2. The circuit claimed in claim 1 wherein said feedback circuitry includes a first resistance in series between said compacitor and said transistor base and a second resistance between said base and said output electrode.

3. The circuit claimed in claim 2 wherein said signal bypass means includes a diode, the anode of said diode being coupled to the junction of said capacitor and said first resistance, the cathode of said diode being coupled to said output electrode.

* * * * *